United States Patent
Zhang et al.

(10) Patent No.: US 10,333,468 B2
(45) Date of Patent: Jun. 25, 2019

(54) TERAHERTZ WAVE FAST MODULATOR BASED ON COPLANAR WAVEGUIDE COMBINING WITH TRANSISTOR

(71) Applicant: University of Electronic Science and Technology of China, Chengdu, Sichuan (CN)

(72) Inventors: Yaxin Zhang, Sichuan (CN); Han Sun, Sichuan (CN); Yuncheng Zhao, Sichuan (CN); Shixiong Liang, Sichuan (CN); Ziqiang Yang, Sichuan (CN)

(73) Assignee: University of Electronic Science and Technology of China, Chengdu, Sichuan Province (CN)

( * ) Notice: Subject to any disclaimer, the term of this patent is extended or adjusted under 35 U.S.C. 154(b) by 184 days.

(21) Appl. No.: 15/620,836

(22) Filed: Jun. 13, 2017

(65) Prior Publication Data
US 2017/0279410 A1    Sep. 28, 2017

(51) Int. Cl.
*H01P 3/08* (2006.01)
*H03C 1/36* (2006.01)

(52) U.S. Cl.
CPC ............ *H03C 1/36* (2013.01); *H01P 3/08* (2013.01)

(58) Field of Classification Search
CPC .................................. H03C 1/36; H01P 3/08
See application file for complete search history.

(56) References Cited

U.S. PATENT DOCUMENTS

| | | | |
|---|---|---|---|
| 9,853,361 B2 * | 12/2017 | Chen | H01Q 21/005 |
| 2009/0262766 A1 * | 10/2009 | Chen | H03C 7/027 |
| | | | 372/26 |
| 2014/0085711 A1 * | 3/2014 | Sonkusale | H01P 7/082 |
| | | | 359/350 |

* cited by examiner

*Primary Examiner* — Jeffrey M Shin

(57) ABSTRACT

A terahertz wave fast modulator based on coplanar waveguide combining with transistor is disclosed. The terahertz waves are inputted through a straight waveguide structure, and then are coupled through a probe structure onto a core part of the present invention, which includes a suspended coplanar waveguide structure and a modulation unit with high electron mobility transistor, wherein the suspended coplanar waveguide structure is formed by three metal wires and a semiconductor substrate; and the modulation unit with high electron mobility transistor is located between adjacent metal transmission strips of the coplanar waveguide structure. Transmission characteristics of the terahertz waves in the coplanar waveguide structure are changed through the switching on/off of the modulation unit, so as to fast modulate the amplitudes and phases of the terahertz waves, and finally the modulated terahertz waves are transmitted through a probe—waveguide structure.

4 Claims, 3 Drawing Sheets

TERAHERTZ WAVE FAST MODULATOR BASED ON COPLANAR WAVEGUIDE COMBINING WITH TRANSISTOR

BACKGROUND OF THE PRESENT INVENTION

Field of Invention

The present invention belongs to the technical field of electromagnetically functional devices, focuses on fast dynamically functional devices for terahertz band, and is adapted for terahertz wave modulators, terahertz wave switches, and terahertz wave phase shifter.

Description of Related Arts

As one of the most important core technologies in the terahertz communication system, the terahertz wave dynamically functional device, such as the terahertz external modulator now becomes the focus of terahertz science and technology research. At present, the terahertz external modulator is studied internationally through quasi-optical method, and however, this method is large in insertion loss, more in unit structures, and difficult to increase the modulation rate. Therefore, the fast modulation of terahertz waves transmitted in space has not been achieved so far. Chinese Patent No. 201510894480.5 disclosed a terahertz wave fast modulator based on coplanar waveguide combining with transistor, which comprises an input straight waveguide, a coplanar waveguide and an output straight waveguide, wherein the coplanar waveguide comprises a substrate and a feeder unit located on the substrate; the feeder unit comprises an input section, a transmission section and an output section; the transmission section comprises a central feeder and two resonant feeders respectively located at two sides of the central feeder; the input section of the feeder unit is set in the input straight waveguide, the output section thereof is set in the output straight waveguide; a voltage input wire is externally connected with the central feeder of the coplanar waveguide; at least one modulation unit with high electron mobility transistor is set between the resonant feeders and the central feeder; a modulation unit with high electron mobility transistor is switched on/off through an external voltage. The above modulator can control transmission characteristics of the terahertz waves transmitted on coplanar waveguide microstrips, so as to achieve the high-speed control of the amplitude of the terahertz waves transmitted at a specific frequency.

SUMMARY OF THE PRESENT INVENTION

A technical problem to be solved of the present invention is to provide a modulator which utilizes an external voltage signal to fast dynamically control terahertz waves, so as to efficiently and fast modulate amplitudes of the terahertz waves.

To solve the technical problem, a technical solution adopted by the present invention is as follows. The terahertz waves are inputted through a straight waveguide structure, and then are coupled through a probe structure onto a core part of the present invention, which combines a transistor with a coplanar waveguide structure and comprises a suspended coplanar waveguide structure and a modulation unit with high electron mobility transistor, wherein the suspended coplanar waveguide structure is formed by three metal wires and a semiconductor substrate; and the modulation unit with high electron mobility transistor is located between adjacent metal transmission strips of the coplanar waveguide structure. Transmission characteristics of the terahertz waves in the coplanar waveguide structure are changed through the switching on/off of the modulation unit, so as to fast modulate the amplitudes and phases of the terahertz waves, and finally the modulated terahertz waves are transmitted through a probe—waveguide structure.

Therefore, a terahertz wave fast modulator based on coplanar waveguide combining with transistor, provided by the present invention, comprises an input straight waveguide structure, a coplanar waveguide structure and an output straight waveguide structure, wherein: the coplanar waveguide structure comprises a substrate and a feeder unit located on the substrate; the feeder unit comprises a central feeder and two resonant feeders respectively located at two sides of the central feeder; the central feeder of the coplanar waveguide structure is externally connected with a voltage input wire, at least one modulation unit with high electron mobility transistor is located between the resonant feeders and the central feeder, the modulation unit with high electron mobility transistor is switched on/off through an external voltage; the modulation unit with high electron mobility transistor comprises an HEMT (high electron mobility transistor), a short feeder and a SRR (split ring resonator); the HEMT comprises a source, a drain, a gate and a doped heterostructure; the SRR is connected with the resonant feeders through the short feeder; the doped heterostructure is located at an opening of the SRR for connecting two ends of the opening with each other; one end of a gate feeder is located on the doped heterostructure and disconnected with the SRR, the other end of the gate feeder is connected with the central feeder.

Further, six modulation units with high electron mobility transistor are respectively located at two sides of the central feeder of the coplanar waveguide structure.

Further, the substrate of the coplanar waveguide structure is made from AsGa, AlGaN, SiC or GaN.

Further, the doped heterostructure is made from AlGaN/GaN, InGaN/GaN, AlGaAs/GaAs, AlGaAs/InGaAs, or AlGaAs/InGaAs/InP.

Beneficial effects of the present invention are as follows.

(1) The coplanar waveguide structure is combined with the multiple modulation units with high electron mobility transistor which are distributed in a form of an array to effectively reduce loss of the terahertz waves and simultaneously modulate the terahertz waves at high speed.

(2) The resonant structure provided by the present invention is different from the conventional SRR, which comprises an HEMT at an opening of the SRR, so as to highly-effective switch resonant modes of the resonant structure, for dynamically controlling resonant frequency and resonant strength of the modulator, so that the transmitted terahertz waves are efficiently modulated to modulate the broadband and high modulation depth, which brings great values to the development of terahertz wideband modulation technology.

(3) Only few and even one modulation unit with high electron mobility transistor is needed to modulate the terahertz waves, the modulation unit has the minimal parasitic capacitance, so that the circuit time constant (such as RC constant) is minimal, the modulation rate is estimated to be above 10 GHz based on the response rate of a single HEMT device, thus the modulation rate is greatly increased.

(4) The multiple modulation units with high electron mobility transistor which are distributed in a form of an array are able to achieve the coupling and conversion of the dipole oscillation mode and equivalent LC circuit resonant mode, so as to enhance the electromagnetic resonance intensity of the terahertz waves, thus greatly increasing the modulation efficiency (such as modulation depth) of the modulation unit to exceed 95%.

(5) For the functional device at the terahertz waveband, the three-dimensional structure design scheme is difficult to be realized by the ordinary mechanical processing method. However, the present invention adopts a two-dimensional planar structure which is able to be realized by the fine processing method, and the process is mature and easy to be manufactured.

(6) The present invention adopts the external voltage to operate without external illumination, temperature and other incentives, and the feeding method is able to be performed by directly using a coaxial SMA interface, which brings great advantages for the device miniaturization, practicality and production.

(7) Terahertz waves with different sizes are able to be controlled through changing structural parameters (such as length, width and opening location) of the modulation unit, so that the present invention is flexible in design and convenient for being customized.

(8) The present invention aims at the waveguide to transmit Terahertz electromagnetic waves, which is able to work at room temperature, atmospheric pressure, non-vacuum conditions, easy to be packaged and convenient for being used.

These and other objectives, features, and advantages of the present invention will become apparent from the following detailed description, the accompanying drawings, and the appended claims.

Figure 1:
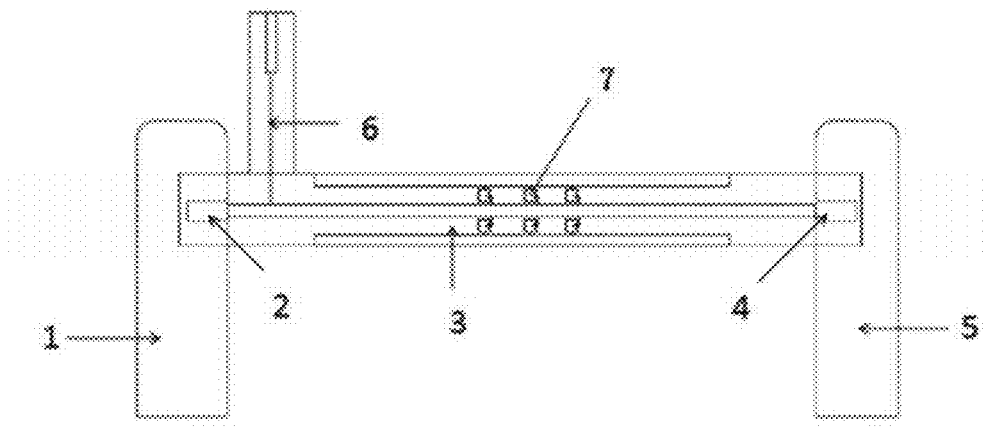
FIG. 1 is a top view of a terahertz wave fast modulator according to a preferred embodiment of the present invention.
Figure 2A:
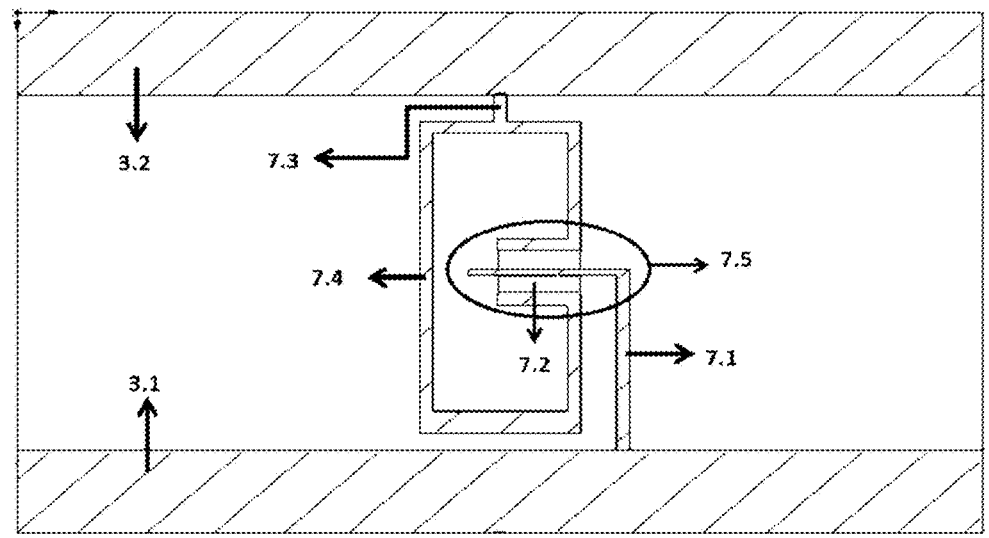
FIG. 2A is a top view of a coplanar waveguide structure and a modulation unit with high electron mobility transistor of the terahertz wave fast modulator.
Figure 2B:
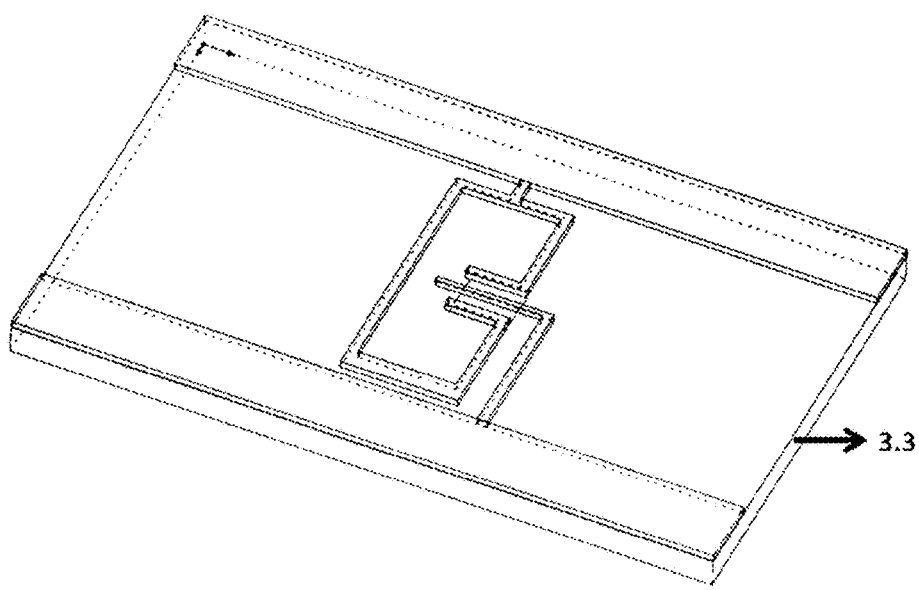
FIG. 2B is a three-dimensional view of the coplanar waveguide structure and the modulation unit with high electron mobility transistor of the terahertz wave fast modulator.

In the drawings, 1: input straight waveguide structure; 2: input probe; 3: coplanar waveguide structure; 3.1: central feeder; 3.2: resonant feeder; 3.3: substrate; 4: output probe; 5: output straight waveguide structure; 6: external feed structure; 7: modulation unit with high electron mobility transistor; 7.1: gate feeder; 7.2: doped heterostructure; 7.3: short feeder; 7.4: SRR (split ring resonator); 7.5 HEMT (high electron mobility transistor).

DETAILED DESCRIPTION OF THE PREFERRED EMBODIMENT

The present invention proposes a design scheme which utilizes a waveguide—coplanar waveguide—waveguide structure, comprising multiple modulation units with high electron mobility transistor which are distributed in a form of an array, to dynamically modulate terahertz waves which are transmitted in space. Through simulating calculation and experimental verification, it is proved that a terahertz wave fast modulator based on the above design scheme is simple in structure, easy to be processed and high in modulation depth.

The present invention comprises an input straight waveguide structure 1, an input probe 2, a coplanar waveguide structure 3, an output probe 4, an output straight waveguide structure 5, an external feed structure 6 and multiple modulation units with high electron mobility transistor 7.

The coplanar waveguide structure 3 comprises a substrate 3.3 and a feeder unit located on the substrate 3.3, wherein the feeder unit comprises a central feeder 3.1 and two resonant feeders 3.2 respectively located at two sides of the central feeder 3.1. Each of the modulation units with high electron mobility transistor 7 comprises an HEMT (high electron mobility transistor) 7.5, a short feeder 7.3 and a SRR (split ring resonator) 7.4, wherein the SRR 7.4 is connected with the resonant feeders 3.2 through the short feeder 7.3; one end of a gate feeder 7.1 is located on a doped heterostructure 7.2 and disconnected with the SRR 7.4, the other end of the gate feeder 7.1 is connected with the central feeder 3.1. The gate feeder 7.1 is connected with the central feeder 3.1 for controlling the switching on/off of the SRR 7.4.

The HEMT 7.5 of each of the modulation units with high electron mobility transistor 7 comprises a source, a drain, a gate and a doped heterostructure 7.2, wherein the source and the drain are connected with a metal structure at an opening of the SRR 7.4, the doped heterostructure 7.2 is located at the opening of the SRR 7.4 for connecting two ends of the opening with each other, and the gate is located a central position of the opening of the SRR 7.4 and connected with the central feeder 3.1 of the coplanar waveguide structure 3.

The multiple modulation units with high electron mobility transistor 7 are located between the resonant feeders 3.2 and the central feeder 3.1, wherein a half of the multiple modulation units with high electron mobility transistor 7 are located at one side of the central feeder 3.1, and a remaining half of the multiple modulation units with high electron mobility transistor 7 are located at the other side of the central feeder 3.1; also, all the multiple modulation units with high electron mobility transistor 7 are located at one side of the central feeder 3.1. An amount of the multiple modulation units with high electron mobility transistor 7 is not less than one.

The substrate 3.3 of the coplanar waveguide structure 3 is made from AsGa, AlGaN, SiC or GaN. An epitaxial layer of the HEMT is made from AlGaN/GaN, InGaN/GaN, AlGaAs/GaAs, AlGaAs/InGaAs, or AlGaAs/InGaAs/InP.

Figure 3:
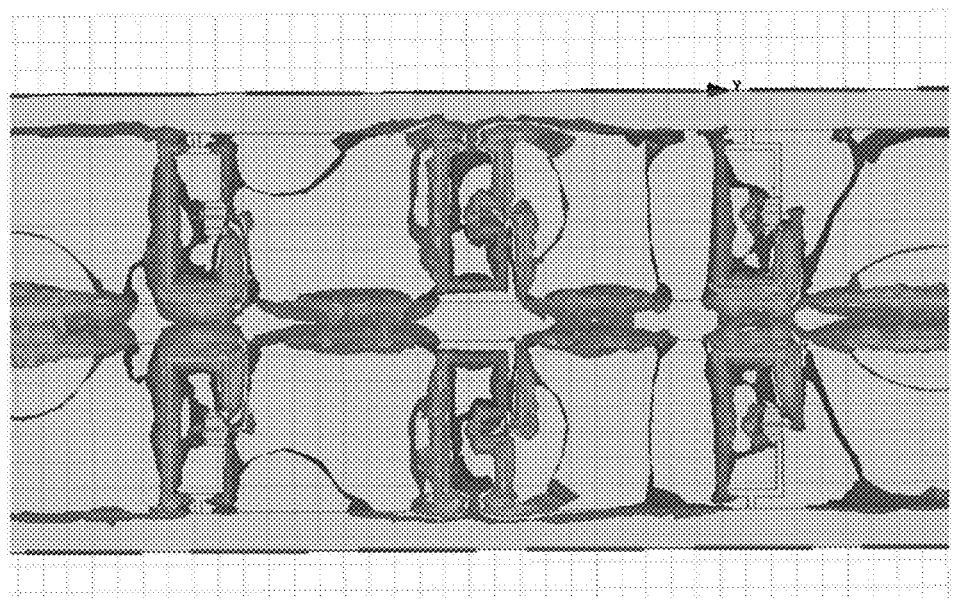
FIG. 3 shows the electric field distribution in an externally positive voltage (connected) state.
Figure 4:
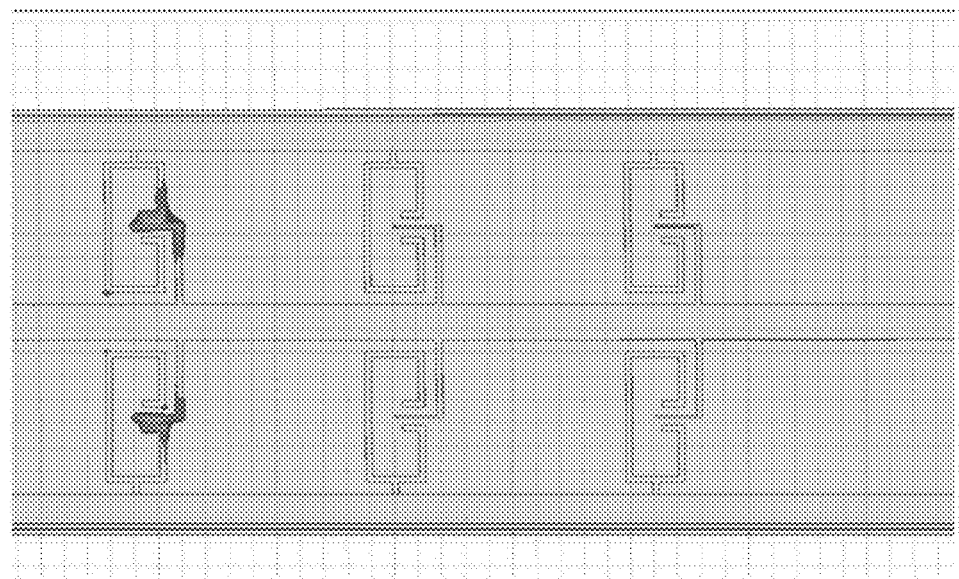
FIG. 4 shows the electric field distribution in an externally negative voltage (disconnected) state.
Figure 5:
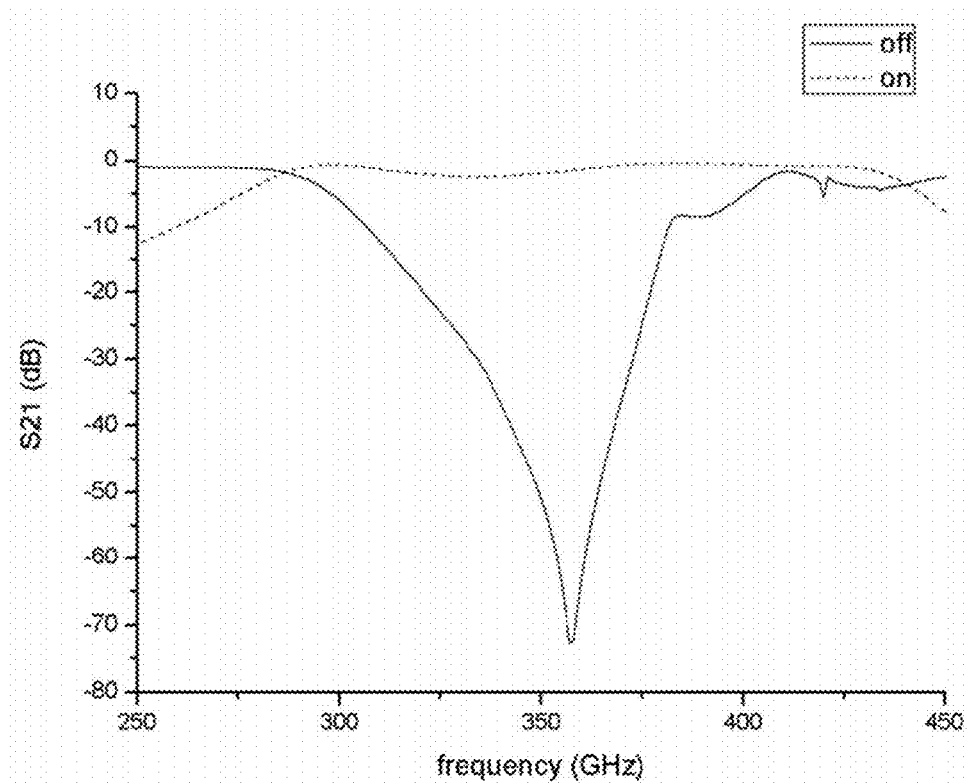
FIG. 5 shows the comparison of S21 parameters (Scattering-Parameter 21) of the terahertz wave fast modulator under different conditions.

The terahertz wave fast modulator provided by the present invention dynamically modulates the terahertz waves which are transmitted in space through the switching on/off of the HEMT, which is embodied as follows. Referring to FIG. 3, when an external voltage control is applied to switch on the HEMT, the opening of the SRR 7.4 is in a connected state, so that the SRR 7.4 is unable to resonate near a specified operating frequency in this situation, thus the terahertz waves are able to be well fast transmitted through suspended coplanar waveguide wires in a mutually coupled manner. Referring to FIG. 4, when the external voltage control is applied to switch off the HEMT, the SRR 7.4, which is adapted for connecting metal strips at two sides of the coplanar waveguide structure 3 with an intermediate metal strip thereof, is in a disconnected state, so that the SRR 7.4 which are symmetrical to each other up and down work independently from each other in this situation, so as to form LC oscillation mode. At this time, electromagnetic energies of the transmitted terahertz waves are mainly concentrated at the opening of the SRR 7.4, so that the transmission along the metal strips is unable to be carried out. Therefore, through the external voltage signal, the switching on/off of the HEMT is able to be fast controlled to fast modulate an electric field intensity of the SRR 7.4, so that the terahertz waves are fast modulated through a voltage control method. As shown in FIG. 5, when the external voltage control is applied to switch on/off the HEMT, a corresponding transmission coefficient in a switching on/off state of the HEMT has more than 60 dB amplitude regulation, which indicates that the terahertz wave fast modulator is able to efficiently modulate the terahertz waves. FIG. 5 shows a modulation result at a working frequency of 0.36 THz.

The SRR 7.4 is more convenient for adjusting structural parameters (such as length, width and opening location), so that the resonant frequency is much easier to be adjusted. Moreover, the SRR 7.4 has stronger electromagnetic effect than the resonance formed by simple metal electrodes, so that better amplitude modulation effect and modulation depth are obtained.

It is proved that the above terahertz wave fast modulator is feasible by simulating through three-dimensional electromagnetic simulation software. FIG. 3 and FIG. 4 show the transmittance spectra and resonant mode results of the terahertz waves in the situation of the switching on/off of the terahertz wave fast modulator through electromagnetic simulation. The results show that when the externally electronic control is applied to switch on/off the the terahertz wave fast modulator, the distribution of the electric field during the transmission of the terahertz waves in the device changes, resulting in a significant change in the field strength after the terahertz waves pass through the HEMT, thus a passing rate of the terahertz waves is changed from passing-through to truncation, or from truncation to passing-through, so as to modulate the amplitude of the terahertz waves.

When the HEMT is switched on, it can be seen from FIG. 3 that the fields are able to be fast transmitted from the structure in a mutually coupled manner, and meanwhile the terahertz waves are also switched on. FIG. 4 simulates the HEMT is switched off, it is able to be seen that the opening of the SRR 7.4, which is adapted for connecting the metal strips located at two sides of the copular waveguide structure 3 with the intermediate metal strip, is also in the disconnected state; so that up and down independent LC oscillation modes are formed, the fields are mainly concentrated at the central position of the opening of the SRR 7.4; accordingly, it is able to be seen from the transmission coefficient diagram that the terahertz waves are unable to pass through the device. Accordingly, it is proved that the terahertz wave fast modulator is able to highly-efficient modulate the terahertz waves; moreover, the HEMT has an extremely fast on/off rate, so that the terahertz wave fast modulator is able to fast modulate the terahertz waves. Therefore, the terahertz wave fast modulator based on coplanar waveguide combining with artificial electromagnetic media is a device which highly-efficient and high-speed works in the THz frequency band, which provides a good idea and direction for designing and manufacturing the future THz functional device.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A terahertz wave fast modulator based on coplanar waveguide combining with transistor, comprising an input straight waveguide structure (1), a coplanar waveguide structure (3) and an output straight waveguide structure (5), wherein:
    the coplanar waveguide structure (3) comprises a substrate (3.3) and a feeder unit located on the substrate (3.3);
    the feeder unit comprises a central feeder (3.1) and two resonant feeders (3.2) respectively located at two sides of the central feeder (3.1);
    the central feeder (3.1) of the coplanar waveguide structure (3) is externally connected with a voltage input wire, at least one modulation unit with high electron mobility transistor (7) is located between the resonant feeders (3.2) and the central feeder (3.1), the modulation unit with high electron mobility transistor (7) is switched on/off through an external voltage; the modulation unit with high electron mobility transistor (7) comprises an HEMT (high electron mobility transistor) (7.5), a short feeder (7.3) and a SRR (split ring resonator) (7.4);
    the HEMT (7.5) comprises a source, a drain, a gate and a doped heterostructure (7.2); the SRR (7.4) is connected with the resonant feeders (3.2) through the short feeder (7.3); the doped heterostructure (7.2) is located at the opening of the SRR (7.4) for connecting two ends of the opening with each other; one end of a gate feeder (7.1) is located on the doped heterostructure (7.2) and disconnected with the SRR (7.4), the other end of the gate feeder (7.1) is connected with the central feeder (3.1).

2. The terahertz wave fast modulator based on coplanar waveguide combining with transistor, as recited in claim 1, wherein: six modulation units with high electron mobility transistor (7) are respectively located at two sides of the central feeder (3.1) of the coplanar waveguide structure (3).

3. The terahertz wave fast modulator based on coplanar waveguide combining with transistor, as recited in claim 1, wherein: the substrate (3.3) of the coplanar waveguide structure (3) is made from AsGa, AlGaN, SiC or GaN.

4. The terahertz wave fast modulator based on coplanar waveguide combining with transistor, as recited in claim 1, wherein: the doped heterostructure (7.2) is made from AlGaN/GaN, InGaN/GaN, AlGaAs/GaAs, AlGaAs/InGaAs, or AlGaAs/InGaAs/InP.

* * * * *